United States Patent [19]

Doll

[11] Patent Number: 5,330,611
[45] Date of Patent: Jul. 19, 1994

[54] CUBIC BORON NITRIDE CARBIDE FILMS

[75] Inventor: Gary L. Doll, Southfield, Mich.

[73] Assignee: General Motors Corporation, Detroit, Mich.

[21] Appl. No.: 909,917

[22] Filed: Jul. 7, 1992

Related U.S. Application Data

[63] Continuation-in-part of Ser. No. 446,758, Dec. 6, 1989, Pat. No. 5,139,391, and a continuation-in-part of Ser. No. 670,823, Mar. 18, 1991, abandoned.

[51] Int. Cl.$^5$ .............................................. C30B 29/36
[52] U.S. Cl. .................................. 117/105; 427/255.1; 117/108; 117/904; 117/951; 117/952
[58] Field of Search ............... 156/610, 609, 614, 605, 156/DIG. 68; 427/255.1, 255.2; 437/132; 148/DIG. 113; 204/192.15

[56] References Cited

U.S. PATENT DOCUMENTS

| | | | |
|---|---|---|---|
| 3,877,060 | 4/1975 | Shono et al. | 357/61 |
| 4,118,539 | 10/1978 | Hirai et al. | 156/614 |
| 4,177,474 | 12/1979 | Ovshinsky | 357/61 |
| 4,297,387 | 10/1981 | Beale | 427/42 |
| 4,565,741 | 1/1986 | Morimoto et al. | 428/427 |
| 4,683,043 | 7/1987 | Melton et al. | 204/192.15 |
| 4,714,625 | 12/1987 | Chopra et al. | 427/47 |
| 4,772,927 | 9/1988 | Saito et al. | 357/23.7 |
| 4,809,056 | 2/1989 | Shirato et al. | 357/23.7 |
| 4,832,986 | 5/1989 | Gladfelter et al. | 427/255 |
| 4,843,031 | 6/1989 | Ban et al. | 437/935 |
| 4,892,791 | 1/1990 | Watanabe et al. | 428/698 |
| 4,906,587 | 3/1990 | Blake | 357/23.7 |
| 4,914,491 | 4/1990 | Vu | 357/23.7 |
| 4,950,618 | 8/1990 | Sundaresan et al. | 357/23.7 |
| 4,957,773 | 9/1990 | Spencer et al. | 427/255.2 |
| 4,961,958 | 10/1990 | Desphandey et al. | 427/38 |
| 4,973,494 | 11/1990 | Yamazaki | 427/255.2 |
| 4,980,730 | 12/1990 | Mishima et al. | 357/61 |
| 5,080,753 | 1/1992 | Doll et al. | 156/609 |
| 5,081,053 | 1/1992 | Heremans et al. | 437/40 |
| 5,085,166 | 2/1992 | Oka et al. | 118/50.1 |
| 5,096,740 | 3/1992 | Nakagama et al. | 427/53.1 |
| 5,139,591 | 8/1992 | Doll et al. | . |
| 5,142,350 | 8/1992 | Heremans et al. | . |

FOREIGN PATENT DOCUMENTS

| | | | |
|---|---|---|---|
| 2339583 | 8/1977 | France | 156/600 |
| 57-122515 | 7/1982 | Japan | 357/61 |
| 59-114853 | 7/1984 | Japan | 357/61 |
| 61-84379 | 4/1986 | Japan | 427/53.1 |
| 61-149477 | 7/1986 | Japan | 357/61 |
| 61-222111 | 10/1986 | Japan | 357/61 |
| 62-77454 | 4/1987 | Japan | . |
| 243770 | 10/1987 | Japan | . |
| 63-120429 | 6/1988 | Japan | 357/61 |
| 63-129631 | 6/1988 | Japan | 357/61 |

OTHER PUBLICATIONS

Patents Abstracts of Japan vol. 13, No. 39 (C-563) Jan. 27, 1989 & JP-A-63 238 270 (Fujitsu) *abstract*.
H. Sankur et al, "Formation of Dielectric and Semiconductor Thin Films by Laser Assisted Evaporation", Appl. Phys. A 47, 271 (Nov. 1988).
B. E. Williams et al, "Chararacterization of Diamond Thin Films", J. Mat. Res. 4, 373 (Mar./Apr. 1989).
J. S. Speck et al, "Microstructural Studies of Laser Irradiated Graphite Surface", J. Mat. Res 5, 980 (May 1990).
S. V. Gaponov et al, "Processes Occurring in an Erosion Plasma During Laser . . . ", Sov. Tech. Phys. 27, pp. 1130-1133 (Sep. 1982).

(List continued on next page.)

Primary Examiner—Robert Kunemund
Attorney, Agent, or Firm—Cary W. Brooks

[57] ABSTRACT

Thin films of cubic boron nitride carbide are provided on an underlying silicon substrate. The cubic boron nitride carbide films are deposited using laser ablation methods. The boron nitride film has a crystallographic lattice constant which can be varied depending upon the desired film composition and processing parameters. Preferably, the resulting thin film composition is characterized by a chemical formula of $(BN)_{1-x}C_x$ where x is about 0.2. The resulting films are particularly suitable for wear resistance and semiconducting applications over a wide range of temperatures.

19 Claims, No Drawings

OTHER PUBLICATIONS

S. J. Thomas et al, "Observation of the Morphology of Laser-Induced Damage in Copper Mirrors", Appl. Phys. Lett. 40, 200 (Feb. 1982).

J. E. Rothenberg et al, "Laser Sputtering, Part II, The Mechanism of the Sputtering of $Al_2O_3$, ", Nucl. Instr. and Meth. B1, 291 (Feb. 1984).

B. D. Cullity, "Elements of X-ray Diffraction" 2nd Edition, (Addison-Wesley, Reading, Mass., 1978), p. 142.

R. N. Sheftal et al, "Mechanism of Condensation of Heteroepitaxial $A^3B^5$ Layers . . . ", Crys. Res. Tech. 16(8), pp. 887–891 (1981).

G. L. Doll et al, "Effects of Excimer Laser Ablation on the Surfaces of the Hexagonal Boron Nitride Targets", Mat. Res. Soc., Boston, Mass. (Nov. 26, 1990).

D. Dijkkamp et al, "Preparation of Y-Ba-Cu Oxide Superconductor Thin Films . . . ", App. Phys. Lett. 51, pp. 619–621 (Aug. 24, 1987).

Q. Y. Ying et al, "Nature of In-situ Superconducting Film Formation", Appl. Phys. Lett. 55(10), pp. 1046–1043 (Sep. 4, 1989).

J. T. Cheung et al, "Growth of Thin Films by Laser-Induced Evaporation", CRC Critical Reviews in Solid-State and Materials Sciences, vol. 15, Issue 1, pp. 63–109 (1988).

J. P. Rebouillat et al, "Laser Ablation Deposition (LAD) of Metallic Thin Films", Proceedings of the Materials Research Society, vol. 151, pp. 259–264 (Apr. 1989).

H. Schwartz et al, "Vacuum Deposition by High Energy Laser with Emphasis on Boron Titanate Films", J. Vac. Sci. Techn., vol. 6, No. 3, pp. 373 (1969), Month unknown.

S. G. Hansen et al, "Formation of Polymer Films by Pulsed Laser Evaporation", Appl. Phys. Lett. 52(1), pp. 81–83 (Jan. 4, 1988).

R. J. Nemanich et al, "Light Scattering Study of Boron Nitride Microcrystals", Phys. Rev. B, vol. 23, No. 12, pp. 6348 (Jun. 15, 1981).

A. R. Badzian, "Cubic Boron Nitride-Diamond Mixed Crystals", Mat. Res. Bull., vol. 16, pp. 1385–1393, (Nov. 1981).

G. Kessler et al, "Laser Pulse Vapour Deposition of Polycrystalline Wurtzite-type BN", *Thin Solid Films*, vol. 147, pp. L45-L50 (Feb. 16, 1987).

P. T. Murray et al, "Growth of Stoichiometric BN Films by Pulsed Laser Evaporation", *Mat. Res. Soc. Cymp. Proc.*, vol. 128, pp. 469–474 (1989).

G. L. Doll et al, "X-ray Diffraction Study of Cubic Boron Nitride Films Grown Epitaxially on Silicon", Mat. Res. Soc., Boston, Mass. (Apr. 1990).

E. G. Bauer et al, "Fundamental Issues of Heteroepitaxy", J. Mat. Res. vol. 5, No. 4, pp. 852–895 (Apr. 1990).

S. Koizumi et al, "Epitaxial Growth of Diamond Thin Films on Cubic Boron Nitride . . . ", Appl. Phys. Lett. 57(6), pp. 563–565 (Aug. 1990).

S. P. S. Arya et al, "Preparations, Properties and Applications of Boron Nitride Thin Films", Thin Solid Films 157, pp. 267–282 (Feb. 29, 1988).

Landolt-Bornstein, Numerical Data and Functional Relationships in Science and Technology, vol. 17, Semiconductors (1982).

Rother et al, "Preparation & Characterization of Ion Plated Boron Nitride", Thin Solid Films, vol. 143, pp. 83–99 (1986).

Weismantel et al, "Preparation and Properties of Hard i-C and i-BN Coatings", Thin Solid Films, vol. 98, pp. 31–44 (1982).

Doll et al, "Laser Deposited Cubic Boron Nitride Films", MRS Spring Meeting, Apr. 1990, San Francisco, Calif.

Doll et al, "Laser Deposition Cubic Boron Nitride Films on Silicon", 2nd Int. Conf. in The New Diamond Sci. & Tech. Sep. 23–27, 1990, Wash. Dc.

Doll et al, "The Growth & Characterizaton of Epitaxial Cubic Boron Nitride Films on Silicon", submitted to Phy. Rev. Lett. Oct. 25, 1990.

Electronics Letters, vol. 25, No. 23, Nov. 9, 1989, pp. 1602–1603; T. K. Paul et al.: "Laser-assisted deposition of BN films on InP for MIS applications" *Whole document*.

Thin Solid Films, vol. 153, No. 1, Oct. 26, 1987, pp. 487–496; P. Lin et al.: "Preparation and properties of cubic boron nitride coatings" *Abstract*.

CUBIC BORON NITRIDE CARBIDE FILMS

This is a continuation-in-part of U.S. Ser. No. 07/446,758, filed Dec. 6, 1989, now U.S. Pat. No. 5,139,391 and a continuation-in-part of U.S. Ser. No. 07/670,823, filed Mar. 18, 1991, now abandoned, the benefit of the filing dates of each being hereby claimed.

This invention generally relates to the formation of thin films of boron nitride carbide. More particularly, this invention relates to a method for forming these thin films using laser ablation techniques.

This invention is related to copending U.S. patent application entitled "Cubic Boron Nitride Phosphide Films", U.S. Ser. No. 07/670,854, which was filed on the same day as this patent application.

BACKGROUND OF THE INVENTION

The two hardest materials known are diamond and cubic boron nitride. Because of this, there is considerable research involving both of these materials for applications such as wear-resistant coatings, abrasive coatings and acoustic elements, as well as electronic devices. Currently, however, efforts to grow smooth, homogeneous diamond films on suitable substrates have been unsuccessful, thereby precluding the use of diamond thin films as wear-resistant coatings or in electronic devices. Accordingly, there is a strong need for a method for forming diamond films.

Alternatively, a cubic form of boron nitride has been grown on silicon wafers by means of a laser ablation technique, as disclosed in U.S. patent application Ser. No. 07/446,758 to Gary L. Doll et al, entitled "Laser Deposition of Crystalline Boron Nitride Films", filed on Dec. 6, 1989, and assigned to the same assignee of this patent application. With this laser ablation method, single crystal cubic boron nitride films were epitaxially grown on a silicon substrate oriented along the [100] axis, such that the resulting cubic boron nitride films were in epitaxial registry with the underlying silicon substrate. Two epitaxial registries have been observed for cubic boron nitride on silicon. One epitaxy has the principle axis of a cubic boron nitride with a 0.362 nanometer lattice constant parallel to the crystallographic axes of the silicon, such that three cubic boron nitride lattices overlay two silicon lattices. The other epitaxy has the [100] direction of a cubic boron nitride with a lattice constant of 0.384 nanometers notched to align with the [110] silicon axis. In this way, two cubic boron nitride lattices overlay one silicon lattice. Since fewer uncompensated silicon bonds exist in the second epitaxy, it is more energetically favorable than the first.

The cubic boron nitride (BN) material is a most interesting III-V compound from both the practical and scientific viewpoints. The boron nitride phase having this cubic crystal structure is particularly useful since it is characterized by many desirable physical properties besides extreme hardness, including high electrical resistivity and high thermal conductivity. In addition, the cubic boron nitride is relatively inert chemically. Because of these properties, this cubic form of the boron nitride is potentially very useful for many applications, including electronic devices, particularly for use at high temperatures.

Therefore, it is clear that the cubic boron nitride has many useful characteristics. However, in order to successfully grow the cubic boron nitride films on the silicon substrate with energetically favorable epitaxy, the crystallographic lattice for the cubic boron nitride must expand to match the lattice constant of the underlying silicon. In particular, the cubic boron nitride films formed on the silicon substrate by the laser ablation method described above, are characterized by a crystallographic lattice constant of approximately 0.384 nanometers as compared to the lattice constant of approximately 0.362 nanometers for bulk cubic boron nitride powder. Thus, the lattice constant for the cubic boron nitride films formed by the laser ablation method is approximately 5 percent larger than the bulk material. Because of this lattice expansion, two cubic boron nitride unit cells can fit along the [110] silicon direction, so as to result in epitaxial registry between the silicon and cubic boron nitride.

Although this lattice expansion brings the cubic boron nitride into crystallographic registry with the underlying single crystal silicon lattice, a large dislocation energy is always associated with a lattice expansion of this magnitude. It is believed that this large dislocation energy may be accommodated by the presence of pinholes and internal stress within the film. Without these mechanisms, or some other vehicle for accommodating this large dislocation energy, the cubic phase for boron nitride is energetically unfavorable.

However, these mechanisms present serious engineering problems, particularly within electronic devices formed form these films. One problem is that there is a substantial electrical current leakage through the pinholes. This effect, as well as other shortcomings, if not corrected makes the cubic boron nitride a less desirable insulator for a silicon based electronic device as compared to other materials. In addition, the cubic boron nitride films which are formed on silicon using this laser ablation technique are not as hard as the bulk cubic boron nitride.

Therefore, it would be desirable to alleviate these shortcomings of the prior art and provide a film which simulates the desired physical and electrical characteristics of both diamond and cubic boron nitride. In particular, it would be desirable to provide such a film using the laser ablation techniques described above.

SUMMARY OF THE INVENTION

It is the primary object of this invention to provide a thin film layer of cubic boron nitride carbide.

It is a further object of this invention that such a thin film layer of cubic boron nitride carbide be formed using laser ablation techniques.

In accordance with a preferred embodiment of this invention, these and other objects and advantages are accomplished as follows.

Thin films of boron nitride carbide are provided on substrates including silicon substrates. The thin films of boron nitride carbide are formed using laser ablation methods.

The thin films of boron nitride carbide are formed in the following manner. First a single substrate is provided. The substrate is disposed in proximity to an appropriate target. The target includes boron nitride and a predetermined amount of carbon. Alternatively, the target may be formed from boron nitride and a sufficiently high vapor pressure of a carbon-containing gas be employed to react with the boron nitride upon vaporization of the target.

An appropriate laser is used to induce vaporization of the target material. The vaporized material deposits onto a surface of the silicon substrate to form a thin film layer of boron nitride carbide.

An inventive feature of this invention is that the thin film layer of boron nitride carbide is characterized by a crystallographic lattice constant which can be varied depending upon the desired film composition and processing parameters. Preferably, the carbon and boron nitride target, and correspondingly also the resulting thin film composition, has a chemical composition of $(BN)_{1-x}C_x$ where x is about 0.2. Alternatively, the target may be formed from boron nitride and a sufficiently high vapor pressure of a carbon-containing gas be used to introduce the carbon into the boron nitride. This particular composition of $(BN)_{1-x}C_x$ results in a crystallographic lattice constant of approximately 0.36 nanometers. The resulting films are hard, electrically neutral, i.e., adherent to the silicon substrate and therefore are particularly suitable for wear resistance and semiconducting applications over a wide range of temperatures.

In addition, it is foreseeable that the boron nitride carbide films could be deposited in such a manner so as to form a gradient throughout the film. The chemical composition would be approximately $(BN)_{0.8}C_{0.2}$ at the silicon—boron nitride interface and would gradually decrease to a carbon concentration of zero, so as to provide a pure boron nitride surface for any particular applications where a surface of pure boron nitride is desired. Alternatively, the carbon concentration could be increased to an x value of one for purposes of providing a diamond surface. This concentration gradient within the film would be achieved by varying the target composition and/or the vapor pressure of the carbon-containing gas during the laser ablation process.

Other objects and advantages of this invention will be better appreciated from the detailed description thereof, which follows.

DETAILED DESCRIPTION OF THE INVENTION

Thin films of carbon doped boron nitride are provided on silicon substrates. The thin films of carbon doped boron nitride are formed using laser ablation methods.

By doping cubic boron nitride with an appropriate amount of carbon, a cubic ternary compound having the elemental chemical formula, $(BN)_{1-x}C_x$ where x represents the carbon concentration, is achieved. The ternary crystallographic lattice constant can be systematically varied from that of pure cubic boron nitride to that of pure cubic boron carbide, if desired. For example, the carbon concentration may be varied so that $0.1 < x < 1$; $0.1 < x \leq 0.2$; $0 < x \leq 0.2$; $0.2 \leq x \leq 1$; and x may range from about 0.2 to about 1.0.

The relationship between the cubic ternary compound lattice constant (a) and the carbon concentration (x) is expressed by the following equation:

$$a = 0.362(1-x) + 0.356(x)$$

where 0.362 and 0.356 are the crystallographic lattice constants in nanometers for bulk cubic boron nitride (BN) and bulk diamond, respectively. For x equal to 0.2, or $(BN)_{0.8}C_{0.2}$, a ternary lattice constant, a, equal to 0.36 nanometers is obtained.

A preferred method for forming the preferred carbon doped cubic boron nitride films utilizes laser ablation techniques, such as described in the copending U.S. patent application Ser. No. 07/446,758, the disclosure of which is hereby incorporated by reference. Generally, a boron nitride target containing polycrystalline, hexagonally oriented, pyrolitic boron nitride which has been doped and sintered with the preferred amount of carbon $((BN)_{0.8}C_{0.2})$ is provided on a rotating turntable and appropriately located in spaced relationship to the single-crystal silicon substrate within a stainless steel 6-way cross chamber which is evacuated to an appropriately low pressure. The single crystal substrate is heated to a sufficient temperature, approximately 400° C., to ensure good adhesion and crystal growth, and the temperature is maintained during the ablation and deposition process. Higher temperatures up to about 675° C. have been utilized, however the resulting films do not exhibit uniform crystallinity throughout. It has been determined that a temperature of up to about 400° C. provides the optimum crystallographic results within the film.

It is believed if a laser is used so that the energy density of the laser is equal to or greater than the band-gap of the boron nitride, cubic boron nitride films will grow on any substrate without regard to the material in the substrate or its crystallographic orientation. Suitable lasers for this purpose include KrF excimer lasers and ArF lasers. Preferably, the ions are emitted from the target so that the ions can reassociate on the substrate so as to for cubic boron nitride or cubic boron nitride phosphide. The process may be enhanced by using ion-assisted pulsed laser deposition to produce cubic boron nitride films. For example, a Kaufman-type ion source may be used to deliver nitrogen ions to a substrate during laser deposition. With an ion-assisted process, broad-beam ion sources may improve adhesion of the films to a substrate, increase the density of nucleation sites, reduce the tensile stress of the films, assist in a preferential crystal orientation, result in the selection of stronger bonds, and provide stoichiometric nitride films.

Preferably, a KrF excimer laser source operating at an appropriate wavelength and frequency is used as the ablating beam. The laser operates and the ablation occurs in a chamber filled with ultra-high purity nitrogen gas when using the carbon doped boron nitride target. Laser fluencies ranged from about 1.5 to about 5.2 J/cm$^2$. The energy emitted from the laser operating at these parameters would be approximately 5 electron volts, which is approximately 20 percent higher than the disassociation energy required for disassociation of the carbon doped boron nitride target.

The thickness of the cubic boron nitride thin films was determined to vary linearly with laser fluence and the number of laser pulses. At a laser fluence of approximately 3.9 J/cm$^2$, an average deposition rate of approximately 0.182 Angstroms per pulse can be expected. For a 12,000 pulse run and a laser fluency of approximately 1.5 J/cm$^2$, a carbon doped cubic boron nitride film having a thickness of approximately 175 nanometers would be produced. Any thickness within practical considerations could be formed with this method.

An equally preferred method for forming these films is as follows and utilizes the laser ablation method also. The laser is focused on a boron nitride target and the laser chamber is filled with a sufficiently high vapor pressure of a carbon-containing gas. Upon vaporization of the target, the boron nitride material reacts with the carbon within the gas to form the preferred carbon doped cubic boron nitride material which deposits upon the substrate surface.

In particular, light from an appropriate laser, preferably the KrF laser operating at approximately 248 nanometers with a pulse duration of 22 nanoseconds, was focused on a hexagonal boron nitride target in approximately 50 milliTorr of ultra high purity nitrogen gas. The laser fluence was 2.9 J/cm$^2$, and the stainless steel reaction chamber was evacuated using a turbomolecular pump capable of a base vacuum level of $10^{-7}$ Torr. Carbon was incorporated in the films by maintaining a high vapor pressure of any conventional, readily available hydrocarbon species within the chamber. For a 12,000 pulse deposition run, i.e., approximately 20 minutes at 10 pulses per second), and a substrate temperature of about 675° C., a film approximately 120 nanometers thick was produced.

Auger electron spectroscopy and Rutherford backscattering spectroscopy were used to ascertain the elemental composition of the film. The approximate stoichiometry was determined to be $(BN)_{0.8}C_{0.2}$. Rutherford Backscattering spectroscopy revealed that the films showed some degree of crystallinity. This degree of crystallinity is due to the differences in crystallographic lattice constants between the $(BN)_{0.8}C_{0.2}$ material (0.36 nanometers) and the silicon substrate (0.38 nanometers). In addition, a higher degree of crystallinity is observed when higher temperatures are used during the laser ablation step. It is foreseeable that with an optimization of processing parameters, the films could be produced which are completely epitaxial with the underlying substrate, although the carbon doped cubic boron nitride material would exhibit some degree of crystallographic lattice expansion.

X-ray diffraction analysis was performed on the thin films to determine their crystal structure. An x-ray line was observed from the carbon doped boron nitride film which was grown on the [110] silicon substrate which was indexed to a [111] lattice reflection for a cubic material having a lattice constant of approximately 0.36 nanometers. This correlates to a carbon concentration of $x=0.2$ or $(BN)_{0.8}C_{0.2}$. The width of the x-ray diffraction peak correlates to a grain size of approximately 5 nanometers based on the Debye-Scherrer equation for determination.

With this method, the resulting films exhibit excellent scratch resistance and excellent adherence to the silicon substrates.

The optical band gap for these carbon doped cubic boron nitride films was determined by spectroscopic ellipsometry to be about 4.2 electronVolts. This is consistent with the transparency of the film in the visible region of the spectrum, and the shape of the absorption edge is also consistent with optical absorption involving an indirect band gap. This large band gap energy should make this preferred carbon doped cubic boron nitride compound a superior insulator for high-temperature, silicon-based semiconducting devices. Examples would be heterostructures for light emitting diodes or semiconducting lasers, as well as other devices.

In addition, with this method the carbon concentration can be systematically varied within the ternary $(BN)_{1-x}C_x$ compound from $x=0.2$ to $x=0$, or from $x=0.2$ to $x=1$. With either gradual transition, the boron nitride carbide film would act as a buffer layer between the underlying silicon substrate and a cubic boron nitride film or cubic boron carbide film respectively, with minimal stress resulting due to the gradual change in lattice constants throughout the film. This would allow a device to take advantage of the excellent physical properties of cubic boron nitride or cubic boron carbide for electronic, acoustic and tribological applications. It is foreseeable that the concentration could be varied gradually to eliminate the boron nitride completely so as to provide a pure diamond film also.

The carbon composition could be varied by providing a target which is composed of discrete regions, such as like a pie shape, wherein each region has a different predetermined concentration of carbon. The laser would then be focused on each region as necessary to deposit upon the substrate, the carbon doped boron nitride composition having the appropriate carbon concentration. Alternatively, the vapor pressure of the carbon-containing gas would be gradually changed to introduce the desired changes in carbon concentration.

In addition, it is foreseeable that this laser ablation method would be used for deposition of the preferred compound on a more suitable substrate than silicon having a lattice constant near 0.36 nanometers. This would make epitaxial growth of the preferred carbon doped cubic boron nitride films possible. Illustrative possible substrates include copper with a cubic crystallographic lattice constant of approximately 0.36 nanometers, or diamond which has a crystallographic lattice constant of 0.356 nanometers. The laser ablation methods described above would be employed accordingly to form the preferred films on these substrates.

It is also foreseeable that the laser ablation methods could be used to form the preferred epitaxial carbon doped cubic boron nitride film upon the silicon substrate, and then an alternative deposition method could be used to supplement the growth procedure. An illustrative example of such an alternative method would be metallo-organic chemical vapor deposition (MOCVD) techniques. The MOCVD method could be advantageous in that it is easy to accurately adjust and vary the chemical composition of elements, within the MOCVD chamber, thereby permitting facile changes in composition. Further, the deposition rates are higher with the MOCVD technique than with this laser ablation method, particularly for boron nitride which has a low optical absorption and accordingly a low ablation rate. The material deposited by the MOCVD method would retain the cubic crystallographic registry of the carbon doped cubic boron nitride film deposited by the laser ablation method.

With this method, carbon doped cubic boron nitride films are formed. The films are optically smooth, therefore they may be suitable as wear-resistant, low friction coatings on mechanical parts such as piston walls and rotating engine parts for example. In addition, the cubic boron nitride-carbide films could also serve as a replacement for diamond coatings. In addition, it is foreseeable that the films would be suitable for use in high temperature electronic applications, as well as other applications.

In another embodiment of this invention, we have successfully grown oriented, adherent, cubic boron nitride films. The films were grown on (001) faces of silicon using the method of ion-assisted pulse-excimer-laser deposition. We employed a Kaufman-type ion source to deliver nitrogen ions to the substrate during the laser deposition. Although the use of ion-assisted techniques to grown cubic boron films have been described by others such as *Aryan and Amico,* Thin Films 157, 267 (1988) generally, such boron nitride films grown by ion-assisted deposition are not structurally homogeneous and are not very adherent to the substrate. To our knowledge, we have for the first time grown cubic boron nitride films by an ion-assisted pulse-laser deposition technique. The following is a description of an example illustrating the present invention.

The excimer laser beam is focused and rastered across the rotating hexagonal BN target to prevent cratering and excessive beam-induced damage[7]. The energy density of the laser at the target was measured to be ~2.7 J cm$^{-2}$, which under our present growth conditions results in a deposition rate of ~0.1 Å/pulse. One inch diameter Si n-type (001) wafers were etched in a buffered HF solution and placed ~5 cm above the target through a load-lock mechanism in an ultra-high vacuum deposition chamber. The substrates were heated to ~400° C. in vacuum. Nitrogen ions from the ion source were directed approximately 2 cm below the Si surface with a beam voltage of 1000 V. During the deposition, the substrate was biased with a $-1500$ V direct current potential to attract the ions through a coulombic interaction. Due to the geometry of the deposition chamber, we are unable to accurately determine the kinetic energies of the $N^+_2/N^+$ species. From the measured ion-induced decrease in the bias of the substrate holder, we estimate the energies of the ions to be approximately 250 eV. During the deposition, the chamber pressure is stable at $1.2 \times 10^{-4}$ torr.

The deposited films have a bluish color, indicative of an optically transparent, antireflective coating approximately 1000 Å thick on the silicon substrate. High-resolution scanning electron microscopy reveals a flat and featureless surface with the exception of scattered fragments of the hexagonal BN target. Contrary to results previously reported for ion-assisted physical vapor deposited BN films [6], our films are extremely adherent to the substrate and exhibit no evidence of peeling. The films are also resistant to chemical attack by acids that dissolve the silicon substrate.

We have grown for the first time preferentially oriented, and extremely adherent cubic BN films on (001) silicon wafers using the method of ion-assisted laser deposition. The films are almost entirely cubic BN with a small fraction of sp$^2$-bonded material present as either hexagonal BN fragments from the target or as an amorphous BN phase not fond with the electron microscope. Since the substrate apparently plays no significant role in the growth of the cubic BN films in this technique, it should be possible to grow ultra-hard, adherent, wear-resistant cubic BN coatings on technologically important materials such as tool steel and aluminum. Additionally, the ability to grow highly thermally conductive cubic BN on materials other than silicon should enhance its potential as a universally applicable heat sink material.

Where particular aspects of the present invention is defined herein in terms of ranges, it is intended that the invention includes the entire range so defined, and any sub-range or multiple sub-ranges within the broad range. By way of example, where the invention is described as comprising about 1 to about 100% by weight of component A, it is intended to convey the invention as including about 5 to about 25% by weight of component A, and about 50 to about 75% by weight of component A. Likewise, where the present invention has been described herein as including $A_{1-100}B_{1-50}$, it is intended to convey the invention as $A_{1-60}B_{1-20}$, $A_{60-100}B_{25-50}$ and $A_{43}B_{37}$.

While our invention has been described in terms of preferred embodiments, it is apparent that other forms of this method could be adopted by one skilled in the art, such as by substituting various other chemical elements, or by modifying the process parameters such as the laser or the target composition. Accordingly, the scope of our invention is to be limited only by the following claims.

The embodiments of the invention in which an exclusive property or privilege is claimed are defined as follows:

1. A method for forming thin films of cubic boron nitride carbide comprising the following steps:
    providing a substrate comprising silicon;
    providing a target of hexagonal boron nitride which has been diluted with carbon, said target being disposed in proximity with said silicon substrate;
    inducing vaporization of said target using a pulsed excimer laser operating at parameters sufficient to dissociate and vaporize said target, such that the vaporized material deposits onto a surface of said substrate to form a thin film of cubic boron nitride carbide on said surface and so that said film is electrically insulating and wherein said cubic boron nitride carbide includes a portion having the formula $(BN)_{1-x}C_x$ where $0.1 < x < 1$.

2. A method for forming thin films of cubic boron nitride carbide comprising the following steps:
    providing a silicon substrate;
    providing a target of hexagonal boron nitride which has been diluted with carbon, said target being disposed in proximity with said silicon substrate;
    inducing vaporization of said target using a pulsed excimer laser operating at parameters sufficient to dissociate and vaporize said target, such that the vaporized material deposits onto a surface of said silicon substrate to form a thin film layer on said surface having a chemical composition of $(BN)_{1-x}C_x$ where $0.1 < x < 1.0$ and so that said film is electrically insulating.

3. A method as recited in claim 2 wherein $0.1 < x \leq 0.2$.

4. A method as recited in claim 2 wherein said laser is a KrF excimer laser source.

5. A method for forming thin films of cubic boron nitride carbide comprising the following steps:
    providing a silicon substrate oriented essentially throughout along a crystallographic axis of the substrate;
    providing a target of hexagonal boron nitride which has been diluted with carbon, said target being disposed in proximity with said silicon substrate;
    inducing vaporization of said target using a pulsed excimer laser operating at parameters sufficient to dissociate and vaporize said target;
    heating said substrate sufficient to sustain crystal growth, such that the vaporized material deposits onto a surface of said substrate to form a thin film layer of cubic boron nitride carbide on said surface having the chemical composition of $(BN)_{1-x}C_x$ where $0.1 < x \leq 0.2$ and so that said film is electrically insulating.

6. A method as recited in claim 5 wherein said laser is a KrF excimer laser source.

7. A method of forming thin films of cubic boron nitride carbide wherein the carbon concentration is varied throughout the film comprising the following steps:
  providing a substrate;
  providing a target having a plurality of regions, said target comprising hexagonal boron nitride which has been diluted with carbon so that said plurality of regions are characterized by a corresponding plurality of carbon concentrations, said target being disposed in proximity with said silicon substrate;
  heating said substrate to a temperature sufficient to sustain crystal growth on a surface of said substrate;
  inducing vaporization of a first of said plurality of regions on said target using a pulsed excimer laser operating at parameters sufficient to dissociate and vaporize said region which is characterized by a corresponding first carbon concentration;
  such that the first vaporized region material deposits onto said surface of said substrate to form a thin layer of cubic boron nitride carbide having said first carbon concentration on said surface and having the chemical composition of $(BN)_{1-x}C_x$ where $0.1 < x \leq 0.2$; and
  repeating said step of inducing the vaporization of the hexagonal boron nitride/carbon target for each of said plurality of regions on said target so as to result in a cubic boron nitride carbide film having an increasing carbon concentration throughout the film.

8. A method as recited in claim 7 wherein said laser is a KrF excimer laser source.

9. A method for forming thin films comprising the following steps:
  providing a substrate oriented essentially throughout along a single crystallographic axis;
  providing a target of hexagonal boron nitride and a sufficiently high vapor pressure of a carbon-containing gaseous specie, said target being disposed in proximity with said substrate, said vapor pressure being sufficiently high to form a cubic boron nitride carbide compound upon vaporization of said boron nitride target;
  inducing vaporization of said target using a laser operating at parameters sufficient to dissociate and vaporize said target;
  heating said substrate to a temperature sufficient to sustain crystal growth, such that said vaporized material deposits onto a surface of said silicon substrate to form a thin film layer of cubic boron nitride carbide on said surface having the chemical composition of $(BN)_{1-x}C_x$ where x is greater than 0.1 but not greater than about 0.2 and so that said film has a lattice constant of about 0.36 nanometers.

10. A method for forming thin films of cubic boron nitride carbide as recited in claim 9 wherein said vapor pressure of said carbon-containing gaseous specie is varied during said vaporization of said target step such that said thin film layer of cubic boron nitride carbide has a varying chemical composition throughout said film, wherein said carbon concentration varies from $0 < x \leq 0.2$ in the chemical formula of $(BN)_{1-x}C_x$ at the interface between said cubic boron nitride carbide film and said substrate, to an x value ranging from about 0.2 to about 1 at the opposite surface of said film.

11. A method of epitaxially growing a thin film comprising boron nitride on a silicon substrate so that said film is substantially free of pin holes comprising:
  providing a target of hexagonal boron nitride which has been diluted with carbon, said target being disposed in proximity with said substrate;
  inducing vaporization of said target using a pulsed excimer laser sufficient to dissociate and vaporize said target so that the vaporized material deposits onto a surface of said substrate to form a thin film of a ternary compound having the formula $(BN)_{1-x}C_x$ where $0.1 < x \leq 0.2$, and so that said thin film is substantially free of pin holes.

12. A method of forming a cubic boron nitride film substantially free of pin holes on a silicon substrate comprising:
  providing a target having a plurality of regions of hexagonally oriented boron nitride having the formula $(BN)_{1-x}C_x$ where $0 < x \leq 0.2$;
  inducing vaporization of a first region of said target using a pulsed excimer laser so that the vaporized material deposits upon said substrate to form a first layer on said substrate having the formula $(BN)_{1-x}C_x$ where $0 < x \leq 0.2$; and
  selectively inducing vaporization on other regions of said target using said laser so that successive layers of material are deposited on said substrate, each layer having a lower concentration of carbon than the previous layer and so that the top layer is substantially pure cubic boron nitride.

13. A method as set forth in claim 12 wherein said successive layers are deposited so that said top layer of substantially pure cubic boron nitride is substantially free of pin holes.

14. A method comprising:
  providing a silicon substrate;
  providing a first target of boron nitride doped with carbon, and a second target having the formula $(BN)_{1-x}C_x$ where $0 \leq x \leq 1$, said targets being disposed in proximity with said silicon substrate;
  inducing vaporization of a portion of said first target using a pulsed excimer laser sufficient to dissociate and vaporize said portion of the first target so that the vaporized material of the first target deposits onto a surface of said substrate to form a first thin film of a ternary compound having the formula $(BN)_{1-x}C_x$ where $0 < x \leq 0.2$; and
  inducing vaporization of a portion of said second target using a pulsed excimer laser sufficient to dissociate and vaporize said portion of the second target so that the vaporized material of the second target deposits on the surface of the first thin film to form a second thin film having the formula $(BN)_{1-x}C_x$ where $0.2 \leq x \leq 1$.

15. A method as set forth in claim 14 wherein said first thin film is substantially free of pin holes.

16. A method as set forth in claim 14 wherein said first thin film is completely epitaxially with the underlying substrate.

17. A method of using carbon to contract the lattice constant of a film comprising boron and nitrogen comprising:
  providing a substrate;
  providing a target of boron nitride which has been doped with carbon, said target being disposed in proximity with said substrate;
  inducing vaporization of said target using a pulsed excimer laser operating at parameters sufficient to dissociate and vaporize said target, such that the vaporized material deposits onto a surface of said substrate to form a thin film layer comprising a ternary compound comprising boron, nitrogen and carbon having a lattice constant ranging from about 0.356 to about 0.362 nanometers, said film having a cubic crystallographic structure wherein said carbon is equally substituted for both nitrogen and boron.

18. A method of making a film of cubic boron nitride carbide having a gradient of varying carbon concentration comprising:

providing a substrate for depositing film of cubic boron nitride carbide;

providing a first vapor comprising boron, nitrogen and carbon in proximity of said substrate so that said vapor deposits on said substrate to form a first layer of cubic boron nitride carbide having the formula $(BN)_{1-x}C_x$ where $0<x<1$;

providing a second vapor comprising boron, nitrogen and carbon in proximity of said substrate so that said vapor deposits on said first layer to form a second layer of cubic boron nitride carbide having the formula $(BN)_{1-y}C_y$ where $0<y<1$, and wherein x does not equal y and so that said first and second layers form a film of cubic boron nitride having a gradient of varying carbon concentration.

19. A method as set forth in claim 1 wherein said cubic boron nitride carbide film has a thickness of at least 1000 Angstroms.

* * * * *